July 30, 1968 H. Z. BOGERT 3,395,291

CIRCUIT EMPLOYING A TRANSISTOR AS A LOAD ELEMENT

Filed Sept. 7, 1965

*INVENTOR*
HOWARD Z. BOGERT
BY Jack M. Wiseman
ATTORNEY

United States Patent Office 3,395,291

Patented July 30, 1968

3,395,291

CIRCUIT EMPLOYING A TRANSISTOR AS A LOAD ELEMENT

Howard Z. Bogert, Cupertino, Calif., assignor to General Micro-Electronics Inc., Santa Clara, Calif., a corporation of Delaware Filed Sept. 7, 1965, Ser. No. 485,458
5 Claims. (Cl. 307—205)

ABSTRACT OF THE DISCLOSURE

Inverter circuit using source-to-drain circuit of periodically-clocked insulated gate field effect transistor in lieu of usual load resistor for reduction of space and power requirements, and improvement in temperature stability.

*Specification*

The present invention relates in general to a transistor amplifying or inverting stage which employs a transistor as a load resistance.

Several objects of the present invention are:

(1) To provide an inverter or amplifying stage with a load resistance that has a much higher resistance per unit area occupied thereby.

(2) To provide a load resistance that reduces power consumption of its switching circuit.

(3) To provide a load resistance whose operation is controlled by clock pulses to reduce power dissipation.

(4) To provide a circuit in which an insulated gate field effect transistor (IGFET) is employed as a load resistance.

(5) To provide a logic circuit in which the load resistance thereof is a transistor.

(6) To provide a logic circuit in which the load resistance device has a temperature coefficient similar to that of the inverting element of the logic circuit.

(7) To provide a logic circuit in which a field-effect transistor serves as a load resistance with the transconductance of the load transistor being compatible with the transconductance of the inverting element of the logic circuit.

Other objects and advantages of the invention will be apparent to one skilled in the art from the following description taken in conjunction with the accompanying drawings:

*Drawings*

Figure 1:
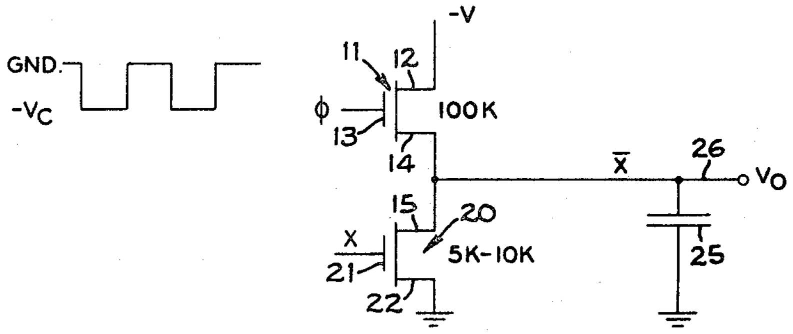
FIG. 1 is a diagrammatic illustration of an inverter circuit for use in a digital logic system.

FIG. 1 shows an inverter for use in a clocked digital data processing system. The inverter circuit comprises a load metal oxide semiconductor transistor or insulated gate field effect transistor (IGFET) 11 that serves as a load resistor. (IGFET) 11 includes a drain electrode 12, a gate or control electrode 13, and a source electrode 14. While reference is made to an inverter circuit, the field-effect transistor 11 may be employed as a load resistor in other logic circuits, such as nand-gate circuits, and-gate circuits, and the like.

The drain electrode 12 of IGFET 11 is connected to a suitable source of D.C. voltage —V. The gate electrode 13 is connected to a source of clock synchronizing pulses $\phi$ which go from ground to a negative voltage $-V_c$ in synchronism with the occurrence of data pulses in the clocked digital logic system. Connected to the source electrode 14 of the transistor 11 is the drain electrode 15 of a logic data input IGFET 20. In addition to the drain electrode 15, transistor 20 includes a gate or control electrode 21 and a source electrode 22. The source electrode

22 is connected to ground and the gate electrode 21 is connected to a source (not shown) of a logic data input signal. Transistors 11 and 20 have their source-drain circuits connected in series.

The circuit including transistors 11 and 20 will normally drive a succeeding stage (not shown) which will present a shunt input capacitance 25 between ground and the junction of transistor 11 and the drain electrode 15 of transistor 20. Over an output conductor 26, is transmitted an inverse output signal, such as a $\bar{X}$, when the input signal is X.

Transistor 11 is enabled when the potential of the clock pulse signal is $V_c$. When the clock pulse signal is at ground, transistor 11 can not conduct. When transistor 11 is not conducting, the resistance between its source and drain electrodes 14 and 12 is very high, i.e., about 100 megohms. When transistor 11 conducts, its source-to-drain or channel "on" resistance is relatively low, i.e., about 100 K ohms.

Transistor 20 is enabled when the input signal applied to the gate 21 thereof is at a negative potential. When the input signal is at ground, transistor 20 can not conduct and its source-drain resistance is very high, i.e., about 100 megohms. When transistor 20 conducts, its source drain resistance thereof is considerably lower, i.e., about 5K–10K ohms.

If transistor 11 is conductive while device 20 is not conducting, the load capacitance 25 will charge negatively over the following path: source V, transistor 11, capacitance 25, and ground.

When transistor 20 conductor capacitance 25 discharges so that output conductor 26 is near ground potential. Since the conducting drain-source resistance of transistor 20 is considerably less than that of transistor 11, transistor 11 serves as a load resistance for transistor 20. Thus capacitance 25 will discharge even if both transistors are conducting simultaneously.

Figure 2:
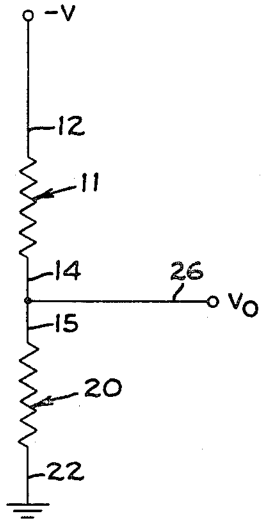
FIG. 2 is an equivalent circuit of the inverter circuit shown in FIG. 1.

As can be easily visualized in FIG. 2, when transistor 20 and device 11 are both conducting, the ratio of their conducting resistances times the source voltage —V will determine the voltage on output conductor 26. For example, with the conducting resistance as stated above (100K ohms for transistor 11 and 10K ohms for transistor 20) the potential $V_0$ on conductor 26 when both devices are conducting will be $-V\times{}^{10}/_{100}$ or —0.1V volts. When transistor 20 is nonconducting and transistor 11 is conducting, the output potential will be —V volts. Since transistor 11 is conductive only at time intervals selected by the clock synchronizing pulse $\phi$, electrical power will be reduced to render the system more efficient than one which uses a conventional fixed load resistor. In addition, the load transistor 11 requires far less space than an equivalent load resistor, thereby providing a significant reduction and space required, especially in integrated circuit versions of the invention. Also the circuit is less effected by temperature variations since the load transistor 11 has a temperature coefficient identical to that of the inverter transistor 20.

It is to be understood that modifications and variations of the embodiment of the invention disclosed may be resorted to without departing from the spirit of the invention and the scope of the appended claims.

I claim:

1. A transistor circuit comprising: a data input transistor having a control electrode and two additional electrodes, a load transistor having a control electrode, and two additional electrodes, means for connecting said two additional electrodes of said load transistor in series with said two additional electrodes of said data input transistor, means for supplying a direct bias potential to said additional electrodes of said load transistor and data input transistors, means for supplying a periodic clock pulse signal to the control electrode of said load transistor for controlling the conduction thereof, means for selectively supplying a data input isgnal to said gate electrode of said data input transistor to effect a current flow through said load transistor while said load transistor is rendered conductive by said periodic signal, the resistance between said two further electrodes of said load transistor when conducting being substantially greater than the corresponding resistance of said data input transistor, and means connected to the commonly-connected electrodes of said load and data input transistors for supplying an output signal.

2. A transistor circuit comprising: a data input field-effect transistor having a gate electrode, a source electrode, and a drain electrode, a load field-effect transistor having a gate electrode, a source electrode, and a drain electrode, means for connecting the source-drain circuit of said data input transistor in series with the source-drain circuit of said load transistor, means for biasing the source-drain circuits of said load and data input transistors, means for supplying a periodic clock pulse signal to the gate electrode of said load transistor for rendering said load transistor alternately conductive and non-conductive, means for selectively supplying a data input signal to the gate electrode of said data input transistor to render said data input transistor conductive while said load transistor is rendered conductive by said periodic signal, the conducting resistance between said source and drain electrodes of said load transistor being substantially greater than that of said data input transistor, and means connected to the common junction between said load and data input transistors for supplying an output signal.

3. A transistor circuit comprising: a data input field-effect transistor having an insulated gate electrode, a source electrode, and a drain electrode, a load field-effect transistor having an insulated gate electrode, a source electrode, and a drain electrode, the source electrode of said load transistor being connected to the drain electrode of said data input transistor, means for supplying a direct bias potential between the drain electrode of said load transistor and the source electrode of said data input transistor, means for supplying a train of clock pulses to the gate electrode of said load transistor for periodically rendering said load transistor conductive, means for selectively supplying a data input signal to the gate electrode of said data input transistor to effect a current flow through data input transistor when said load transistor is rendered conductive by said clock pulses, said load transistor having a source to drain resistance when conducting at least ten times higher than that of said data input transistor, and means connected to the common junction between said load and data input transistors for supplying an output signal.

4. In a clocked digital data processing system of the type including a clock pulse source for synchronizing digital data processing operations so that digital data pulses in said system occur in synchronism with said clock pulses, an improved inverting circuit, comprising:

(a) an inverting transistor and a load transistor, each having a control electrode and two further electrodes, one of the two further electrodes of said load transistor being connected in to one of the two further electrodes of said inverting transistor, (b) a direct current bias source connected between the other of the two further electrodes of said load transistor and the other of the two further electrodes of said inverting transistor, (c) means for connecting said clock pulse source to the control electrode of said load transistor for rendering said load transistor alternately conductive and nonconductive between said two further electrodes thereof, (d) means for supplying said synchronized digital data pulses to said control electrode of said inverting transistor for selectively rendering said inverting transistor conductive between said two further electrodes thereof when said load transistor is rendered conductive by said clock pulses, said load and inverting transistors being selected such that the conducting resistance of said load transistor is substantially higher than that of said inverting transistor, and (e) means connected to the junction of said load and inverting transistors for supplying an output signal therefrom.

5. The inverting circuit of claim 4 wherein said load and inverting transistors are field effect transistors which each have, as the control electrode thereof, an insulated gate electrode, and, as the two further electrodes thereof, a source electrode and a drain electrode.

References Cited

UNITED STATES PATENTS 3,201,574 8/1965 Szekely ---------- 307—88.5 X
3,292,008 12/1966 Rapp -------------- 307—88.5

ARTHUR GAUSS, *Primary Examiner.*

D. D. FORRER, *Assistant Examiner.*